United States Patent
Romanofsky et al.

[11] Patent Number: 6,078,223
[45] Date of Patent: Jun. 20, 2000

[54] DISCRIMINATOR STABILIZED SUPERCONDUCTOR/FERROELECTRIC THIN FILM LOCAL OSCILLATOR

[75] Inventors: Robert R. Romanofsky, Hinckley; Felix A. Miranda, Olmsted Falls, both of Ohio

[73] Assignee: The United States of America as represented by the Administrator of the National Aeronautics and Space Administration, Washington, D.C.

[21] Appl. No.: 09/134,811

[22] Filed: Aug. 14, 1998

[51] Int. Cl.[7] .................................. H03B 5/18; H03L 7/04
[52] U.S. Cl. .................................. 331/9; 331/34; 331/96; 331/117 D; 331/107 S; 331/177 R; 333/219.2; 333/235
[58] Field of Search .................................. 331/1 R, 9, 17, 331/34, 96, 117 D, 107 DP, 107 SL, 107 S, 175, 177 R; 333/219, 219.2, 235, 99 S

[56] References Cited

U.S. PATENT DOCUMENTS

| | | |
|---|---|---|
| 4,097,826 | 6/1978 | Knox et al. . |
| 4,243,949 | 1/1981 | Saul et al. .................................. 331/9 |
| 4,555,683 | 11/1985 | Sorger et al. . |
| 4,853,660 | 8/1989 | Schloemann . |
| 4,873,496 | 10/1989 | Ohgihara et al. . |
| 4,887,052 | 12/1989 | Murakami et al. . |
| 4,945,324 | 7/1990 | Murakami et al. . |
| 5,059,927 | 10/1991 | Cohen . |
| 5,086,304 | 2/1992 | Collins . |
| 5,124,713 | 6/1992 | Mayes et al. . |
| 5,210,541 | 5/1993 | Hall et al. . |
| 5,289,139 | 2/1994 | Fiedziuszko et al. . |
| 5,334,958 | 8/1994 | Babbitt et al. . |
| 5,382,959 | 1/1995 | Pett et al. . |
| 5,434,581 | 7/1995 | Raguenet et al. . |
| 5,472,935 | 12/1995 | Yandrofski et al. . |
| 5,496,796 | 3/1996 | Das . |
| 5,561,407 | 10/1996 | Koscica et al. . |
| 5,589,845 | 12/1996 | Yandrofski et al. . |
| 5,617,104 | 4/1997 | Das . |
| 5,949,311 | 9/1999 | Weiss et al. .............................. 333/202 |

*Primary Examiner*—David Mis
*Attorney, Agent, or Firm*—Kent N. Stone

[57] ABSTRACT

A tunable local oscillator (10) with a tunable circuit (12) that includes a resonator (16) and a transistor (14) as an active element for oscillation. Tuning of the circuit (12) is achieved with an externally applied dc bias (22, 24) across coupled lines (20) on the resonator (16). Preferably, the resonator (16) is a high temperature superconductor microstrip ring resonator with integral coupled lines (20) formed over a thin film ferroelectric material. A directional coupler (38) samples the output of the oscillator (14) which is fed into a diplexer (40) for determining whether the oscillator (14) is performing at a desired frequency. The high-pass and low-pass outputs (42, 44) of the diplexer (40) are connected to diodes (48, 46) respectively for inputting the sampled signals into a differential operational amplifier (50). Amplifier (50) compares the sampled signals and emits an output signal if there is a difference between the resonant and crossover frequencies. Based on the sampled signal, a bias supplied to the ring resonator is either increased or decreased for raising or lowering the resonant frequency by decreasing or increasing, respectively, the dielectric constant of the ferroelectric.

22 Claims, 3 Drawing Sheets

DISCRIMINATOR STABILIZED SUPERCONDUCTOR/FERROELECTRIC THIN FILM LOCAL OSCILLATOR

TECHNICAL FIELD

This invention relates in general to a tunable oscillator for alleviating bit error rate (BER) degradation. Specifically, this invention relates to a tunable discriminator stabilized high temperature superconductor ferroelectric thin film local oscillator for communications systems.

BACKGROUND ART

High frequency receivers for satellite or ground terminal applications require low phase noise oscillators. As the utilized spectrum moves into the millimeter (mm) wavelength bands, phase noise becomes a greater concern for communication systems and particularly digital satellite communication systems. Crystal stabilized oscillators are devices that are suitable up to frequencies near 1 gigahertz (GHz). This is because the highest fundamental frequency achievable from a crystal is a few hundred megahertz (MHZ), and phase noise scales as $N^2$, where N is the frequency multiplication factor. At higher frequencies, dielectric-resonator-oscillators (DROs) are the component of choice. Despite their high Q values (low phase noise), these components are inadequate to prevent bit error rate (BER) degradation and are expensive because it cannot be produced lithographically.

U.S. Pat. No. 4,887,052 to Murakami, et al. describes a tunable oscillator utilizing a thin film ferromagnetic resonator which is phase locked and operates in the GHz range for satellite communications. The Murakami, et al. device employs a phase locked loop to provide a reference signal to which the ferromagnetic resonator can lock on. Thus, this approach necessitates a separate reference signal source. Furthermore, the use of thin ferromagnetic film technology requires rather complicated circuitry to supply a control current and high magnetic field.

U.S. Pat. Nos. 5,589,845 and 5,472,935 to Yandrofski, et al. describe the application of ferroelectric and superconducting thin films to a variety of tunable microwave components.

U.S. Pat. Nos. 5,617,104 and 5,496,796 issued to Das describe a high temperature superconducting (HTS) tunable ferroelectric transmitting system which is based in a bulk single crystal requiring the application of kilovolts to induce tuning. Das describes several different realizations of his systems which include an antenna, a filter and an oscillator that require a microprocessor. This configuration would appear to make the system more cumbersome and expensive, particularly for integration into miniaturized systems and for high volume production.

U.S. Pat. No. 4,873,496 to Ogihara, et al. discloses a tunable local oscillator based in a common gate serial feedback type. The Ogihara, et al. device employs an Yttrium-Iridium-Garnet (YIG) ferrite component as the resonant element and a GaAs FET as the active component. Although the Ogihara, et al. approach capitalizes on the utilization of the second harmonic rather than the fundamental so as to reduce the magnitude of the external dc magnetic field required for tuning, the circuit implementation appears to be rather difficult because of the use of a magnetic coil and a current source to generate the magnetic field. This increases the size and complexity of the circuit rendering it less compatible for integration in monolithic microwave integrated circuit (MMIC) based working systems.

U.S. Pat. No. 5,289,139 to Fiedziuzsko, et al. describes a so-called "push-push" oscillator circuit based on an annular resonator as a stabilizing element of a two branch local oscillator. There appears to be no mechanism in this patent which allows for adjusting the operation frequency of the oscillator. Also, the oscillator's only feature for phase noise reduction is the potentially high quality factor (Q) of the superconducting resonator (since phase noise is inversely proportional to the square of Q).

U.S. Pat. No. 4,097,826 to Knox, et al. describes several versions of insular wave guides, dielectric-based ring resonator filters. These filters are intended for broad frequency range operation (i.e., 1 to 1,000 GHz), and generally could have applications for communication subsystems. In particular, this patent appears to be concerned with the filter component of the receiver rather than with the local oscillator component. The local oscillator described therein is tuned by either a tuning short, by varying the bias current applied through the coaxial transmission line, or by applying dc voltages to a diode forming part of the oscillators as seen in FIGS. 2 through 6.

U.S. Pat. No. 4,555,683 to Sorger, et al. describes different versions of tunable resonators and filters implemented with a disk shaped ferrimagnetic disk. This patent relates to tunable resonators and components where the tuning element is a ferrimagnetic single crystal rather than a ferroelectric thin film. Tuning is induced by an externally applied magnetic field generated by current transmission lines wrapped around the ferrimagnetic disk.

U.S. Pat. No. 5,059,927 to Cohen describes a lumped circuit, ultra-wide band tuning voltage controlled oscillator (VCO) with a Gunn diode as an active element which exhibits a 20 GHz tuning range at V-band. This device reduces the phase noise of the oscillator by enhancing the Q of the oscillator, and provides full microwave band coverage with fewer VCOs, because of its ultra-wide band range, smaller size and lower cost than most commercially available VCOs. The tuning element in this device is a diode whether it is a Gunn or Avalanche diode.

U.S. Pat. No. 4,945,324 to Murakami, et al. describes a tunable filter where the tunable element is comprised of ferromagnetic thin films (Yttrium Iron Garnet, "YIG") hosted in a non-magnetic substrate (Gallium Gadolinium Garnet, "GGG"). This patent addresses typical problems associated with ferromagnetic-based tunable resonators such as limited tunable frequency band, variation of the three dB bandwidth across the tunable frequency band and diminishes spurious characteristics by controlling or adjusting the coupling coefficient across the band. In particular, the patent appears to deal with a tunable filter with the tunability being attained through the use of ferromagnetic films.

U.S. Pat. No. 4,853,660 to Schloemann, et al. describes a multi layer ferromagnetic circuit capable of being tuned with an appropriate magnetic field. Again, this patent is representative of tunable technology enabled with the use of ferromagnetic materials as tunable elements as opposed to ferroelectric materials. Tunability is produced by the application of an external dc magnetic field which intrinsically makes the circuit implementation more difficult.

U.S. Pat. No. 5,334,958 to Babbitt, et al. has similarities to U.S. Pat. No. 5,561,407 to Koscica, et al. in that they describe a phase shifter that employs a slab of ferroelectric material upon which a microstrip line is patterned. This same line is then biased and an electric field is generated in the slab perpendicular to the propagation velocity. This is a form of a ferroelectric phase shifter.

Other patents of interest include U.S. Pat. No. 5,382,959 to Pett, et al. which relates to a high performance circularly polarized antenna complex. U.S. Pat. No. 5,210,541 to Hall, et al. also involves antenna applications. U.S. Pat. No. 5,434,581 to Raguenet, et al. describes a technique for enhancing the bandwidth of a microstrip patch antenna or an array of such patches. U.S. Pat. No. 5,124,713 to Mayes, et al. describes a particular type of antenna element. U.S. Pat. No. 5,086,304 to Collins relates to a cost competitive alternative to reflector type antennas.

There still exists a need for a tunable local oscillator which offers a high Q value (low phase noise) with a locked mode to further reduce phase noise. Such a tunable local oscillator would operate at frequencies at least as high as 60 GHz and preferably with approximately a 5% tuning range around the carrier frequency. The frequency tuning would be based on altering the dielectric constant of the ferroelectric film by applying a fixed dc voltage. The tunable local oscillator would have the ability to be implemented to perform at both room temperature using conventional conductors and at cryogenic temperatures using superconductors. Preferably, a portion of the output signal at the fundamental frequency would be sampled with a diplexer feedback circuit. An error signal would be used to tune a composite ferroelectric/superconductor resonator thereby keeping it locked to a predetermined frequency. Wideband tuning would be achieved by simultaneously controlling the crossover frequency of the diplexer and the fundamental frequency of the resonator. Such a tunable local oscillator would include a technique for capitalizing on the high Q of superconductors and the frequency agility of ferroelectric thin films simultaneously. It would allow a method for dynamically tuning the circuit. The tunable local oscillator would alleviate bit error rate (BER) degradation for various applications and in particular digital satellite communication systems.

DISCLOSURE OF INVENTION

It is an object of the present invention to provide a tunable local oscillator for alleviating bit error rate degradation in communication systems.

It is a further object of the present invention to provide a tunable local oscillator for direct operation up to at least 60 GHz without the need for frequency multiplication (N) and without substantial degradation of phase noise by $N^2$.

It is a further object of the present invention to provide a tunable discriminator stabilized high temperature superconductor ferroelectric thin film local oscillator which provides diminished bit error rate.

It is a further object of the present invention to provide a tunable ring resonator operating as high as 60 GHz.

It is a further object of the present invention to provide a tunable local oscillator with discriminator-locking means for the output of the oscillator and to provide integrated feedback to voltage tune the ferroelectric component.

It is a further object of the present invention to provide a tunable local oscillator that employs a rather low bias voltage for tuning the thin film ferroelectric local oscillator.

It is a further object of the present invention to provide a local oscillator that offers a high Q (low phase noise) with the use of superconductors and tunability with the use of ferroelectric films to provide a locked mode to further reduce phase noise.

It is a further object of the present invention to provide a tunable local oscillator which samples its own signal and compares it to the crossover point of a diplexer filter in order to tune and lock the resonator so as not to require a separate reference signal source.

It is a further object of the present invention to provide a tunable local oscillator that provides the insertion of a ferroelectric film in the stabilizing resonator in combination with a feedback loop that not only allows for adjusting the frequency but further contributes to reducing the phase noise with its use of a superconductor.

It is a further object of the present invention to provide a tunable local oscillator where frequency tuning is based on altering the dielectric constant in the ferroelectric film by applying a fixed dc voltage.

It is a further object of the present invention to provide a tunable local oscillator for operation at high frequencies up to at least 60 GHz with approximately a 5% tuning range around the carrier frequency.

It is a further object of the present invention to provide a tunable local oscillator that can be implemented to perform both at room temperature and at cryogenic temperatures.

Further objects of the present invention will be made apparent following the Best Modes for Carrying Out Invention and the appended claims.

The foregoing objects of the present invention are accomplished with a high frequency locked superconductor ferroelectric thin film tunable local oscillator. The tunable local oscillator in accordance with the present invention comprises a feedback circuit and a tunable circuit including a resonator with coupling means. The coupling means is formed over a thin film ferroelectric material and constructed to confine a major portion of the electromagnetic energy in an odd mode of propagation for concentrating an electric field in the thin film ferroelectric material. The tunable circuit further includes an active element in a feedback loop with the resonator to provide a loop gain in excess of unity. A dc bias with an offset voltage is applied across the coupling means for tuning the dielectric constant of the thin film ferroelectric material to a desired value. A directional coupler in communication with the tunable circuit samples a portion of the output power therefrom. A diplexer in communication with the directional coupler receives the sampled portion of output power and determines whether the sampled portion of output power is at a predetermined resonant frequency. The diplexer has a crossover frequency that corresponds to an intended operational frequency. The diplexer further includes a high-pass output and a low-pass output with detecting means such as diodes connected to the high-pass and low-pass outputs. A differential operational amplifier receives signals from the high-pass and low-pass outputs, compares the signals, and emits an output signal if there is a difference in input signal amplitude to the resonator. The output signal indicates that the resonant and crossover frequencies disagree. In this manner, a sampled high-pass output signal causes the dc bias to be lowered which results in an increase in the dielectric constant of the thin film ferroelectric material and a lower resonant frequency. If a low-pass output signal is sampled, the operational amplifier emits an output signal that causes the dc bias to be increased which results in a decrease in the dielectric constant of the thin film ferroelectric material and a higher resonant frequency.

Preferably, the resonator in the present invention is a high temperature superconductor microstrip ring resonator and the coupling means are integral coupled lines. Alternately, the resonator can also be a linear microstrip line with at least one set of interdigital coupled lines. As another alternative the resonator can be a contiguous linear or ring microstrip type resonator.

While the resonator preferably is a high temperature superconductor material, the high temperature superconductor material can be replaced with a conventional conductor, e.g., gold, silver, copper, etc., if moderate Q values are tolerable.

The tunable local oscillator in accordance with the present invention further includes an alternate embodiment where the coupling means could be parallel plate capacitors.

The active element for the tunable circuit is preferably a pseudomorphic high electron mobility transistor (PHEMT), or a high electron mobility transistor (HEMT), or even a heterojunction bipolar transistor (HBT). Other suitable transistors include a field effect transistor (FET) or a bipolar junction transistor.

In the preferred embodiment, the coupled lines are positioned at a voltage maxima along the high temperature superconductor microstrip ring resonator and the dc bias includes lines attached at a voltage minima along the high temperature superconductor microstrip ring resonator so as to diminish the loading of the ring.

Preferably, the tunable local oscillator according to the present invention further includes a low pass filter positioned prior to the differential operational amplifier to remove any unwanted RF signals.

BEST MODES FOR CARRYING OUT INVENTION

The present invention resides in a frequency locked tunable local oscillator which is preferably a superconductor ferroelectric thin film local oscillator. High frequency receivers for satellite or ground terminal applications require low phase noise oscillators. Phase noise has become a greater concern for communication system engineers as the utilized spectrum moves into the millimeter (mm) wavelength bands. Investigations have begun into the impact of local oscillator phase noise on adjacent channel interference for wavelength bands at approximately 28 Gigahertz (GHz). The present invention is directed to an approach that alleviates bit error rate (BER) degradation and a device that is readily incorporated into a cryogenically cooled transceiver.

A primary objective of the present invention is to alleviate bit error rate degradation for a digital satellite communication system. Of course, the tunable local oscillator of the present invention may be employed in other applications as well.

Figure 1:
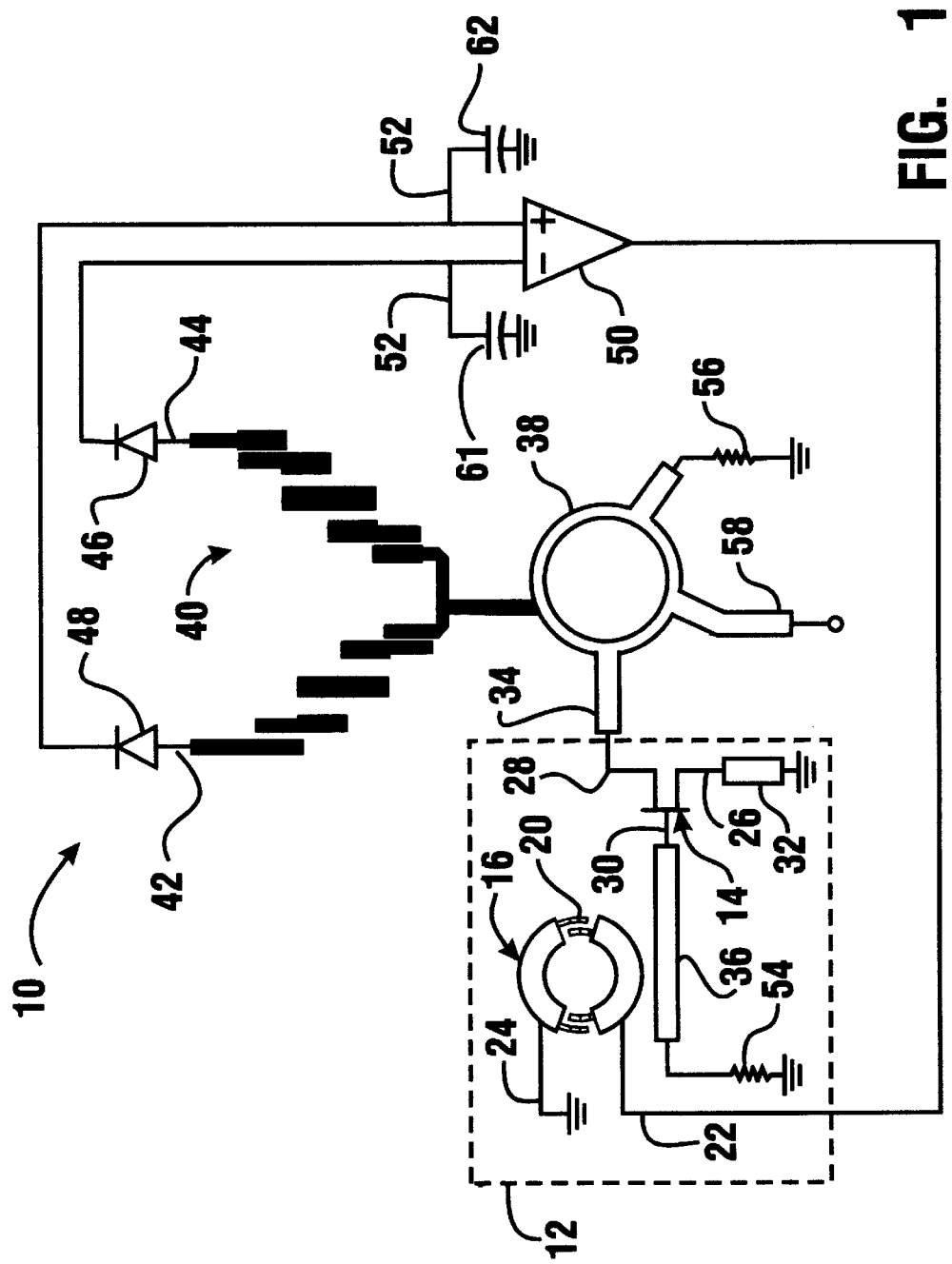
FIG. 1 shows a schematic view of the circuitry of the tunable local oscillator in accordance with the present invention.

Referring to FIG. 1, there is shown a tunable local oscillator generally designated 10 in accordance with the present invention. Preferably, tunable local oscillator 10 is a discriminator stabilized superconductor ferroelectric thin film local oscillator comprising the following components. A tunable circuit 12 incorporates an active element 14 for oscillation which is preferably either a low noise pseudomorphic high electron mobility transistor (PHEMT), or a high electron mobility transistor (HEMT), or a heterojunction bipolar transistor (HBT). Of course, other suitable transistors would include a field effect transistor (FET) or a bipolar junction transistor. Tunable circuit 12 also includes a resonator 16 which is preferably a high temperature superconductor (HTS) microstrip ring resonator with integral coupled lines 20, and having a circumference which is preferably an integer number of guided wavelengths. The coupled lines 20 are formed over a thin film ferroelectric material including but not limited to $SrTiO_3$, $Ba_xSr_{1-x}TiO_3$, $Pb(Sr_9Ti)O_3$, $BaTiO_3$, $LiNbO_3$, etc. Suitable high temperature superconductor material includes but is not limited to superconducting material having a general formula of Tl—Ba—Ca—Cu—O, Hg—Cd—Bd—Cu—O and Y—Ba—Cu—O, for example, $Tl_2Ba_2Ca_2Cu_3O_{10+x}$, or $Tl_2Ba_2Ca_1Cu_2O_{8+x}$, La—Ba—Cu—O system, or even Bi—Ca—Sr—Cu—O system.

The high temperature superconductor material is deposited on the thin film ferroelectric material by using sol-gel, chemical vapor deposition, physical vapor deposition, sputtering, or other suitable techniques. Sol-gel deposition and chemical vapor deposition of superconducting thin films and ferroelectric thin films is disclosed in U.S. Pat. Nos. 5,119,760 and 5,138,520.

The coupled lines 20 are preferably optimized so that most of the electromagnetic energy is confined in the odd mode of propagation. This mode maximizes the concentration of the electric field in the thin film ferroelectric material. This is an important point since the dielectric properties of ferroelectric materials are very sensitive to dc fields.

Tuning of the tunable circuit 12 is achieved by an externally applied dc bias 22 across the coupled lines 20. Resonator 16 is grounded via line 24. A fixed offset voltage with respect to a ground plane is applied across the lines so as to allow for tuning of the dielectric constant of the ferroelectric first to a set value and then to higher or lower values for adjustment. In the preferred embodiment, the coupled lines 20 are positioned at approximately a voltage maxima along the resonator 16 to enhance the tuning thereof. The bias lines 22, 24 are attached approximately at a voltage minima along the resonator 16 so as to diminish the loading of the resonator 16.

Transistor 14 includes a source 26, a drain 28 and a gate 30. Three transmission lines 32, 34 and 36 are connected, respectively, to the source 26 terminal, the drain 28 terminal, and the gate 30 terminal, of the transistor 14. Preferably, the transmission lines 32, 34, 36 are disposed on a top surface of a dielectric layer in a microstrip structure known in this art. The source 26 terminal is grounded via the transmission line 32. Transmission line 36 terminates with a grounded resistor 54 to provide an impedance $Z_0$. The output of the active element 14 of the oscillator is fed through the drain terminal 28 and transmission line 34 into a hybrid ring or directional coupler 38 so that a portion of the output power can be sampled.

Directional coupler 38 is grounded with resistor 56 that provides a matched impedance $Z_0$ to reduce reflections and maximize a power transfer. The sampled power is fed into a discriminator locking means 40, such as a diplexer, as a means to determine whether or not the oscillator 14 is performing at the desired frequency. The crossover frequency of the diplexer 40 corresponds to the intended operation frequency of the resonator 16 in the absence of tuning. A high-pass output 42 and a low-pass output 44 of the diplexer 40 are fed into detecting means such as diodes 46, 48 which sample the signal from the low-pass output 44 and high-pass output 42, respectively, from the diplexer 40. The dc component of these sampled signals is input into a means for comparing the sampled signals, for example, preferably a differential operational amplifier 50 that includes filter means 52, for example, lines that are grounded through capacitors 61, 62 by which RF components are grounded and filtered out for low-pass filtering to remove unwanted RF signals.

Differential operational amplifier 50 compares the high-pass signal with the low-pass signal for determining whether the resonant and crossover frequencies disagree. If the resonant and crossover frequencies disagree, differential operational amplifier 50 emits an output signal for either increasing or decreasing the bias supplied via line 22 to the ring resonator 16.

If a high-pass signal is sampled, the bias supplied to resonator 16 is lowered, i.e., the dielectric constant of the ferroelectric increases resulting in a lower resonant frequency. If a low-pass signal is sampled, the bias to the resonator 16 is increased, i.e., the dielectric constant of the ferroelectric decreases resulting in a higher resonant frequency.

Directional coupler 38 provides the local oscillator 10 output signal to the communication device via transmission line 58.

An alternate embodiment of the present invention includes the realization that the geometry of the resonator 16 can be structured in other forms such as a linear microstrip line with at least one set of interdigital coupled lines, or alternately, a ring resonator 16 where the integral coupled lines 18 are replaced with parallel plate capacitors (not shown). Another alternate embodiment includes a contiguous ring resonator.

Figure 2:
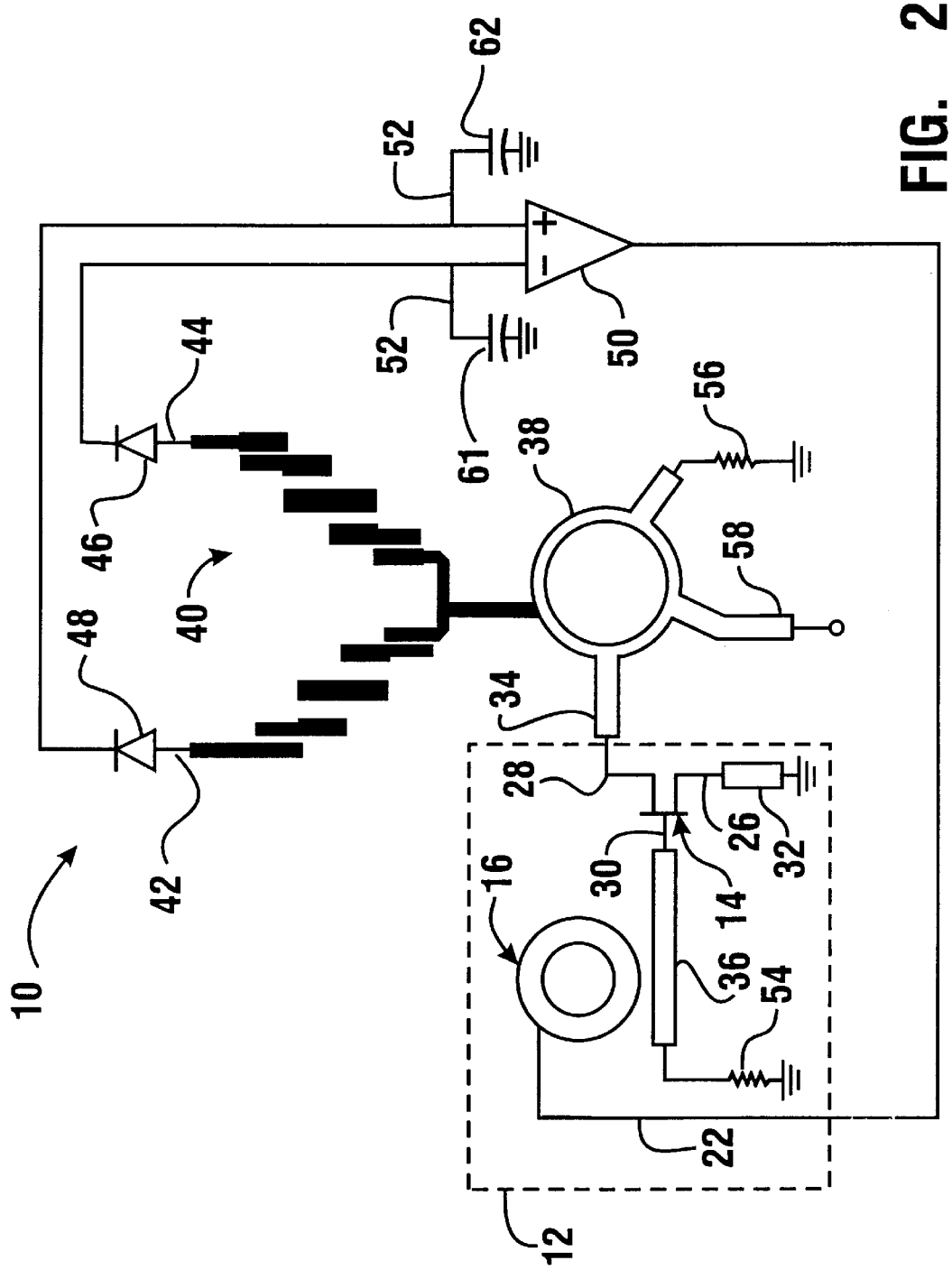
FIG. 2 shows the circuitry of a tunable local oscillator having a ring resonator.
Figure 3:
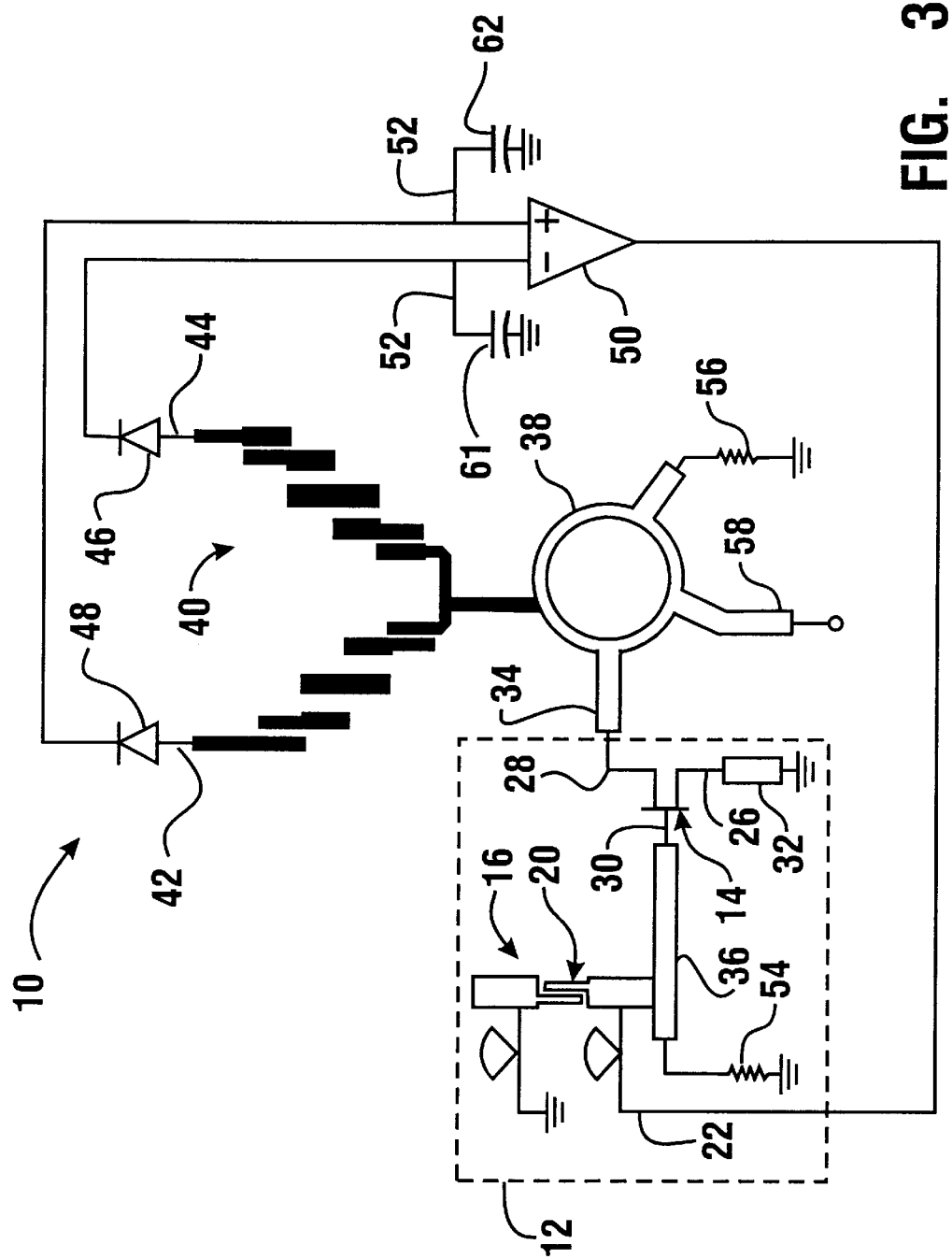
FIG. 3 shows the circuitry of a tunable local oscillator having a linear resonator with a set of coupled lines.

FIG. 2 shows the circuitry of a tunable local oscillator having a contiguous ring resonator 16 with bias applied directly to the ring. FIG. 3 shows the circuitry of a tunable local oscillator having a linear resonator 16 with a set of coupled lines 20, such as interdigital coupled lines.

If moderate Q values are tolerable, the HTS material may be replaced by a conventional conductor, e.g., gold, silver, copper, etc.

The choice of the ferroelectric material may vary depending upon the intended application of the circuit, i.e., for cryogenic applications an advantageous choice would be $SrTiO_3$. For ambient or room temperature applications, a more convenient choice would include $Ba_xSr_{1-x}TiO_3$ or the like.

Similarly, the geometry of the sampler (directional coupler 38) may be implemented in alternate fashions, such as a "rat-race" coupler, or a microstrip directional coupler or the like.

If frequency stability is less of a concern, the sampling circuitry (diplexer 40, diodes 46, 48, amplifier 50) can be bypassed and a voltage controlled oscillator (VCO) can be employed, e.g., a sweeper.

As opposed to the state of the art crystal stabilized oscillators, the tunable local oscillator according to the present invention allows for direct operation of up to at least approximately 60 GHz without the need for frequency multiplication (N), and thus without degradation due to phase noise by $N^2$.

As opposed to the dielectric-resonator-oscillator (DRO) technology, the present invention provides a convenient method for tuning, and hence frequency locking to minimize phase noise. In the above manner, the tunable local oscillator alleviates bit error rate degradation and is particularly suited for digital satellite communication systems as well as other communication systems and applications suited for a frequency locked tunable local oscillator.

The present invention provides a technique for combining the high Q of superconductors with the tunability of ferroelectric films in the same component. Thus, the tunable local oscillator in accordance with the present invention offers a high Q (low phase noise) and tunability (a locked mode to further reduce phase noise). The present invention samples the output signal and dynamically tunes the ferroelectric resonator to keep it locked.

By sampling its own signal and comparing it to the crossover point by a diplexer feedback circuit, the present invention tunes and locks the resonator. In this way, the present invention allows for adjusting the operation frequency of the oscillator. The present invention provides a frequency tuning that is based on altering the dielectric constant in the ferroelectric film by applying a fixed offset dc voltage.

Thus, the present invention achieves the above-stated objectives, eliminates difficulties encountered with the use of the prior art devices, solves problems and attains the desirable results described herein.

In the foregoing description, certain terms have been used for brevity, clarity and understanding. However, no unnecessary limitations are to be implied therefrom because such terms are used for descriptive purposes and are intended to be broadly construed. Moreover, the descriptions and illustrations herein are by way of examples and the invention is not limited to the details shown and described. Further, in the following claims any feature described as a means for performing a function shall be construed as encompassing any means capable of performing that function and shall not be limited to the particular means shown in the foregoing description or mere equivalents.

Having described the features, discoveries and principles of the invention, the manner in which it is constructed and operated, and the advantages and useful results attained, the new and useful structures, devices, elements, arrangements, parts, combinations, systems, equipment, operations and relationships are set forth in the appended claims.

LISTING OF REFERENCE NUMERALS

10 tunable local oscillator
12 tunable circuit
14 active element
16 resonator
20 coupled lines
22 dc bias lines
24 dc bias lines
26 source
28 drain
30 gate
32 transmission lines
34 transmission lines
36 transmission lines
38 directional coupler
40 diplexer
42 high pass output
44 low pass output
46 low pass output diode
48 high pass output diode
50 differential operational amplifier
52 filter means
54 resistor 56 resistor
58 transmission line
61 capacitor
62 capacitor

We claim:

1. A tunable local oscillator, comprising:
   a tunable circuit, said tunable circuit including a resonator having coupling means, said coupling means being formed over a thin film ferroelectric material, said coupling means being constructed to confine a major portion of electromagnetic energy in an odd mode of propagation for concentrating an electric field in said thin film ferroelectric material, said tunable circuit further including a transistor coupled to said resonator, wherein the resonator is constructed to be frequency locked,
   a dc bias with an offset voltage applied across said coupling means for tuning a dielectric constant of said thin film ferroelectric material to a set value, wherein the dielectric constant of said thin film ferroelectric material is altered upon a change in the dc bias;
   a directional coupler in communication with said tunable circuit for sampling a portion of output power therefrom;
   a diplexer in communication with said directional coupler for receiving the sampled portion of output power, said diplexer determining whether the sampled portion of output power is at a predetermined resonant frequency, said diplexer having a crossover frequency corresponding to an intended operation frequency, said diplexer further including a high-pass output and a low-pass output; and
   detecting means connected to said diplexer for receiving said high-pass and low-pass output signals therefrom, said detecting means comparing said signals and emitting an output signal to said resonator if there is a difference in said resonant and crossover frequencies, whereby a sampled high-pass output signal causes said dc bias to be lowered, resulting in an increase in the dielectric constant of said thin film ferroelectric material and a lower resonant frequency, and a sampled low-pass output signal cause said dc bias to be increased resulting in a decrease in the dielectric constant of said thin film ferroelectric material and a higher resonant frequency.

2. A tunable local oscillator according to claim 1, wherein said resonator is a high temperature superconductor microstrip ring resonator, and said coupling means is integral coupled lines.

3. A tunable local oscillator according to claim 1, wherein said resonator and said coupling means is a linear microstrip line with at least one set of interdigital coupled lines.

4. A tunable local oscillator according to claim 1, wherein said resonator is made of a material being a member selected from the group consisting of high temperature superconductor material, gold, silver and copper.

5. A tunable local oscillator according to claim 4, wherein said resonator is a ring the circumference of which is an integer number of guided wavelengths.

6. A tunable local oscillator according to claim 1, wherein said resonator is a contiguous ring resonator, and bias is applied between said ring and a ground plane to effect tuning.

7. A tunable local oscillator according to claim 1, wherein said coupling means comprises parallel plate capacitors.

8. A tunable local oscillator according to claim 2, wherein said thin film ferroelectric material is a member selected from the group consisting of $SrTiO_3$, $Ba_xSr_{1-x}TiO_3$, $Pb(Sr_9Ti)O_3$, $BaTiO_3$, and $LiNbO_3$.

9. A tunable local oscillator according to claim 1, wherein said transistor is a member selected from the group consisting of HEMT, PHEMT, HBT, FET, and bipolar junction transistor.

10. A tunable local oscillator according to claim 2, wherein said coupled lines are positioned at a voltage maxima along said high temperature superconductor microstrip ring resonator, and said dc bias include lines attached at a voltage minima along said high temperature superconductor microstrip ring resonator so as to diminish a loading of the ring.

11. A tunable local oscillator according to claim 10, wherein said transistor is a PHEMT.

12. A tunable local oscillator according to claim 2, wherein said detecting means further comprises a first diode connected to said high-pass output of said diplexer, a second diode connected to said low-pass output of said diplexer, and a differential amplifier connected to said first and second diodes for receiving signals therefrom.

13. A tunable local oscillator according to claim 12, further comprising low pass filtering means situated prior to said differential amplifier for removing any unwanted RF signals.

14. A tunable local oscillator, comprising:
   a tunable circuit, said tunable circuit having a resonant frequency generating means including an oscillator that is constructed to be frequency locked, said tunable circuit further including tuning means for applying a bias across said resonant frequency generating means;
   means for sampling a portion of output power from said oscillator, said sampling means being in communication with said oscillator;
   means for determining whether said oscillator is operating at a predetermined frequency, said determining means being in communication with said sampling means and having a crossover frequency corresponding to an intended operation frequency, said determining means generating output signals indicative of an operation frequency and the crossover frequency; and
   means for comparing said output signals from said determining means, said comparing means being in communication with said determining means and emitting a control signal if the output signals are different, said control signal being in communication with said tuning means for adjusting said resonant frequency;
   wherein said resonant frequency generating means comprises a high temperature superconductor microstrip ring resonator with integral coupled lines, said integral coupled lines being formed over a thin film ferroelectric material, said bias applied across said coupled lines being a dc bias.

15. A tunable local oscillator according to claim 14, wherein said coupled lines being constructed to confine a major portion of electromagnetic energy in an odd mode of propagation for concentrating an electric field in said thin film ferroelectric material.

16. A tunable local oscillator according to claim 14, wherein said microstrip ring resonator is made from a material being a member selected from the group consisting of high temperature superconductor material, gold, silver, copper, and conventional conducting material.

17. A tunable local oscillator according to claim 14, wherein said sampling means comprises a directional coupler.

18. A tunable local oscillator according to claim 17, wherein said determining means comprises a diplexer having a high-pass output and a low-pass output.

19. A tunable local oscillator according to claim 18, wherein said comparing means comprises a differential operational amplifier connected to a first and a second diode, said first diode being connected to said high-pass output of said diplexer and said second diode being connected to said low-pass output of said diplexer, said differential operational amplifier receiving signals from said first and second diodes and comparing the signals for any difference, said differential operational amplifier emitting a control signal when there is a difference, said control signal being transmitted to said applied dc bias.

20. A tunable local oscillator according to claim 14, wherein said thin film ferroelectric material is a member selected from the group consisting of $SrTiO_3$, $Ba_xSr_{1-x}TiO_3$, $Pb(Sr_9Ti)O_3$, $BaTiO_3$, $LiNbO_3$.

21. A tunable local oscillator according to claim 20, wherein said integral coupled lines are positioned at a voltage maxima along the high temperature superconductor microstrip ring resonator, and said dc bias includes lines attached at a voltage minima along the high temperature superconductor microstrip ring resonator.

22. A tunable local oscillator, comprising:

a tunable circuit, said tunable circuit having a resonant frequency generating means including an oscillator that is constructed to be frequency locked, said tunable circuit further including tuning means for applying a bias across said resonant frequency generating means;

means for sampling a portion of output power from said oscillator, said sampling means being in communication with said oscillator;

means for determining whether said oscillator is operating at a predetermined frequency, said determining means being in communication with said sampling means and having a crossover frequency corresponding to an intended operation frequency, said determining means generating output signals indicative of an operation frequency and the crossover frequency;

means for comparing said output signals from said determining means, said comparing means being in communication with said determining means and emitting a control signal if the output signals are different, said control signal being in communication with said tuning means for adjusting said resonant frequency;

wherein said resonant frequency generating means comprises a linear microstrip line with at least one set of interdigital coupled lines formed over a thin film ferroelectric material, and wherein said bias applied across said coupled lines being a dc bias.

* * * * *